(12) United States Patent
Yuasa et al.

(10) Patent No.: US 6,650,087 B2
(45) Date of Patent: Nov. 18, 2003

(54) VEHICLE HAVING AN ELECTRICAL CONNECTION BOX AND ELECTRICAL CONNECTION BOX FOR USE IN THE VEHICLE

(75) Inventors: Eriko Yuasa, Yokkaichi (JP); Shuji Yamakawa, Yokkaichi (JP); Shinshu Kato, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 299 days.

(21) Appl. No.: 09/897,906

(22) Filed: Jul. 5, 2001

(65) Prior Publication Data

US 2002/0003377 A1 Jan. 10, 2002

(30) Foreign Application Priority Data

| Jul. 4, 2000 | (JP) | ........................... 2000-202235 |
| Jul. 4, 2000 | (JP) | ........................... 2000-202726 |
| Jul. 13, 2000 | (JP) | ........................... 2000-212979 |
| Jul. 13, 2000 | (JP) | ........................... 2000-213084 |
| Jul. 4, 2001 | (JP) | ........................... 2000-202235 |

(51) Int. Cl.$^7$ ................................................. H02J 7/00
(52) U.S. Cl. ................................. 320/107; 439/76.2
(58) Field of Search ....................... 320/107; 439/76.2, 439/34, 709, 732; 174/72 B, 71 B, 88 B

(56) References Cited

U.S. PATENT DOCUMENTS 5,818,121 A    10/1998  Krappel et al. ............ 307/10.7
5,823,798 A  * 10/1998  Zintler et al. ............. 439/76.2
6,008,982 A  * 12/1999  Smith ........................ 361/624
6,368,119 B2 *  4/2002  Murakami ................. 439/76.2
6,443,748 B1 *  9/2002  Yuasa ........................ 439/205
6,478,585 B2 * 11/2002  Yuasa et al. .............. 439/76.2

FOREIGN PATENT DOCUMENTS

EP          0 874 418 A2   10/1998

* cited by examiner

Primary Examiner—Lawrence Luk
(74) Attorney, Agent, or Firm—Oliff & Berridge, PLC

(57) ABSTRACT

An electrical connection box is provided for a vehicle which has a low-voltage battery of maximum output voltage selected from 14V and 28V, and a high-voltage battery of output voltage higher than that of said first battery structure. The electrical connection box has an insulation plate and, fixed on one face of said insulation plate, first bus bars connected in use to the first battery and second bus bars connected in use to the second battery so that the first and second bus bars are at different potentials. In order to reduce a risk of electrical leakage paths on the insulation plate, at least one of the following features is present:

(i) the first bus bars and the second bus bars are separated on the face of the insulation plate by an air insulation zone of width in the range of from about 1 mm to about 30 mm, (ii) an insulation wall stands up on the insulation plate between the first bus bars and the second bus bars, (iii) the second bus bars are embedded in the insulating material.

24 Claims, 13 Drawing Sheets

VEHICLE HAVING AN ELECTRICAL CONNECTION BOX AND ELECTRICAL CONNECTION BOX FOR USE IN THE VEHICLE

BACKGROUND OF THE INVENTION

1. Field of the Invention

The present invention relates to a vehicle, such as an automobile, having an internal combustion engine, batteries powering electrical devices on the vehicle and an electrical connection box which is mounted on the vehicle, and also to electrical connection boxes for use in such a vehicle.

2. Description of the Related Art

Normally one secondary battery, e.g., rechargeable battery, having a rated voltage of 12V and a maximum nominal voltage of 14V is mounted on an internal combustion engine type automobile. A voltage up to the maximum voltage of 14V is applied from the battery to an internal circuit composed of bus bars and the like accommodated in the electrical connection box. The power supply is distributed by the internal circuit of the electrical connection box. The operation of electric/electronic component parts mounted on the vehicle is controlled through electric wires connected with the internal circuit.

In a goods vehicle, such as lorry or truck, a rated voltage of 24V and a maximum voltage of 28V are applied to a circuit, by a battery structure.

In recent years, electric/electronic component parts have been mounted in increasing numbers on a vehicle, and there is an increase in the electric current which is applied to each electric/electronic component part. For example, the electric power required to drive a fan is conventionally 130 watts, but has become 260 watts in recent years. At the rated voltage of 12V of the battery, it has become impossible to operate suction and exhaust devices of an engine, an electromotive power steering, and the like devices, requiring a high voltage such as 36V. Therefore, they are mechanically operated by the driving force of the engine.

With the increase of the electric current applied to each electric/electronic component part, the diameter of the electric wires used has become larger. Further, with rapid increase of the number of electric/electronic component parts, the number of electric wires has increased recently, which has increased the diameter of a wire harness including a bundle of electric wires. Consequently, the weight of the electric wires to be wired on a vehicle body has increased.

As described above, if the power supply from the battery is incapable of operating the suction and exhaust devices of the engine, they are mechanically operated. In this case, it is impossible to accomplish fine control of the operation of the suction and exhaust. Further, much fuel is consumed, which pollutes the environment. Accordingly, it is preferable to operate the suction and exhaust devices of the engine and the like not mechanically by a cam but electrically by the power supply from the battery.

In the case where the circuit is so constructed that a voltage higher than 14V can be applied to the circuit of the electrical connection box composed of bus bars and the like from the battery having the rated voltage of 12V and the maximum voltage of 14V, it is possible to reduce the required electric current and thus the diameter of the electric wires and the size of a bundle of a plurality of electric wires (e.g., wire harness). Therefore, it is possible to reduce the weight of the electric wires.

Further, with the application of a high voltage to the circuit composed of bus bars and the like, it is possible to control the operation of the suction and exhaust devices, the power steering motor, and the like not mechanically or hydraulically but electrically. In this case, it is possible to accomplish fine control of the operation of suction and exhaust devices and the like. Further, fuel consumption can be reduced, which reduces pollution.

It is preferable to apply a high voltage of about 42V to the electromotive power steering motor, the suction and exhaust devices of the engine, the fan, and other devices requiring a high voltage. On the other hand, in an automobile motorcar, it is preferable to apply the rated voltage of 12V (maximum voltage: 14V) to signal-generating devices of the electric/electrical components parts and coils of relays.

However, if the electrical connection box for distributing the power supply is provided with a circuit to which a low voltage up to the maximum voltage of 14V (28V in a truck) is applied and with a circuit to which a high voltage of about 42V is applied, a leak current is liable to be generated between the two circuits owing to the potential difference. Such a leak current may particularly occur if water or dirt enters the electrical connection box. The leak current is also liable to be generated in the circuit to which the high voltage of about 42V is applied.

SUMMARY OF THE INVENTION

It is an object of the present invention to prevent or reduce generation of a leak current in an electrical connection box, thereby permitting a circuit to which electric current having a low voltage is applied and a circuit to which electric current having a high voltage is applied.

According to the present invention, there is provided a vehicle having an internal combustion engine providing motive drive of the vehicle, a first, low-voltage battery structure including at least one secondary battery (rechargeable battery), and having a nominal maximum output voltage selected from 14V and 28V, a second, high-voltage battery structure including at least one secondary battery, and having a nominal maximum output voltage higher than that of the first battery structure and not more than 200V, a plurality of electrical devices powered by the first and second battery structures, and an electrical connection box containing an electrical circuit therein which effects connection between the first and second battery structures and the plurality of electrical devices.

The electrical circuit has an insulation plate and, fixed on one face of the insulation plate, at least one first bus bar (low voltage bus bar) connected to the first battery structure and at least one second bus bar (high voltage bus bar) connected to the second battery structure, whereby in operation the first and second bus bars are at different potentials.

In order to reduce a risk of electrical leakage paths on the insulation plate, at least one of the following features is present:

(i) the first bus bar or bars and the second bus bar or bars are separated on the face of the insulation plate by an air insulation zone containing no bus bars and having a width in a range of from about 1 mm to about 30 mm;

(ii) an insulation wall is upstanding from the face of the insulation plate between the first bus bar or bars and the second bus bar or bars; and (iii) the second bus bar or bars are at least partially embedded in insulating material selected from synthetic resin and grease, while the first bus bar or bars are exposed on the face of the insulation plate.

When feature (i) is present, preferably a plurality of the second bus bars are located at a central region of the face of the insulation plate as seen in plan view while a plurality of the first bus bars are located at a peripheral region of the face as seen in plan view.

In another aspect, the invention provides an electrical connection box adapted for use in a vehicle which has a first low-voltage battery structure including at least one secondary battery and having a nominal maximum output voltage selected from 14V and 28V, and a second high-voltage battery structure including at least one secondary battery and having a nominal maximum output voltage higher than that of said first battery structure and not more than 200V.

The electrical connection box contains an electrical circuit having an insulation plate and, fixed on one face of the insulation plate, at least one first bus bar adapted to be connected in use to the first battery structure and at least one second bus bar adapted to be connected in use to the second battery structure, whereby in operation the first and second bus bars are at different potentials.

In order to reduce a risk of electrical leakage paths on the insulation plate, at least one of the following features is present:

(i) the first bus bar or bars and said the second bus bar or bars are separated on the face of the insulation plate by an air insulation zone containing no bus bars and having a width in the range of from about 1 mm to about 30 mm;

(ii) an insulation wall is upstanding from the face of the insulation plate between the first bus bar or bars and the second bus bar or bars; and (iii) the second bus bar or bars are at least partially embedded in insulating material selected from synthetic resin and grease, while the first bus bar or bars are exposed on the face of the insulation plate.

When feature (i) described above is present, because the air insulation zone or area having the width of about 1 mm–about 30 mm is interposed between the respective regions of the low voltage bus bars, and the high voltage bus bars it is possible to prevent or minimize leak currents from being generated therebetween. As a result, the low-voltage bus bars and the high-voltage bus bars can be arranged on one insulation plate in the same layer. Therefore, it is unnecessary to place the low-voltage bus bars and the high-voltage bus bars in different and separate layers.

Accordingly, it is possible to reduce the size and thickness of the electrical connection box.

The number of the high-voltage bus bars is typically smaller than the number of the low-voltage bus bars. One or more high-voltage bus bars may be connected to one or more low-voltage bus bars through a relay mounted in the electrical connection box. As mentioned above, the high-voltage bus bars are preferably disposed in the center of the insulation plate and the low-voltage bus bars are disposed at the periphery around the high-voltage bus bars. Thereby it is possible to dispose the high-voltage bus bars to be connected to a fuse proximately to a relay connection tab to be connected to the low-voltage bus bar, which allows handling and mounting of the bus bars to be accomplished efficiently.

In the central region in which the high-voltage bus bars are disposed, adjacent high-voltage bus bars are preferably spaced apart by a distance in the range of from about 1 mm to about 30 mm, to avoid the risk that to leak currents are liable to be generated between the adjacent high-voltage bus bars.

When the feature (ii) described above is present, the height h and width w of the partition wall above the face of the insulation plate preferably satisfy the relations (1) and (2):

$$t < h \geq 20t \quad (1)$$

$$1.5 < w \geq 20s \quad (2)$$

where t is the uniform thickness of the first and second bus bars and s is the maximum width of the first and second bus bars. The unit for h, w, t and s is all in mm. More preferably, w and h satisfy the relations (3) and (4):

$$t < h \geq 10t \quad (3)$$

$$1.5 < w \geq 10s \quad (4)$$

In this case, a plurality of the first bus bars are preferably located in a first region of the face adjacent to a first one of opposite edges of the face, while a plurality of the second bus bars are located in a second region of the face which is spaced from the first region and is adjacent the other of said edges of said face.

Alternatively a plurality of the second bus bars may be located at a central region of the face of the insulation plate as seen in plan view while a plurality of the first bus bars are located at a peripheral region of the face as seen in plan view.

When feature (ii) described above is present, preferably an upstanding peripheral wall surrounds a region of the face of the insulation plate at which at least one second bus bar is located, and the insulating material is filled as a layer into a space bounded by the upstanding peripheral wall so as to cover and embed the second bus bar.

When feature (iii) is present, the insulating material is preferably selected from epoxy resin, two-part hardening resin and grease.

To fix the bus bars to the plate, a projection standing up from the insulation plate may be inserted into a hole formed on the bus bar and deformed (caulked) to fix the bus bar to a substrate resinous portion of the insulation plate.

It is preferably that the high voltage applied to the high-voltage bus bar or bars is 42V. In this case, it is easy to provide the voltage applied to the high-voltage bus bar to 42V by connecting in series three batteries each having a rated voltage of 12V (nominal maximum voltage: 14V) generally used in automobiles. Needless to say, it is possible to use a single battery having a maximum voltage of 42V. The reason why the high voltage to be applied to the high-voltage bus bar is set to 42V is partly because using a voltage close to or above 50V for the high-voltage bus bar may be more dangerous. The present inventors have conducted salt water experiments in order to ascertain the degree of the risk when applying a voltage of 42V in an electrical junction box suitable for use in an automobile engine compartment. A description of the experiments is as follows:

1 ml of salt water was injected into each terminal hole of the casing of a junction box which had bus bars disposed inside. Electrical components, such as relay, fuse, connectors etc., were mounted on the casing. A voltage of 42V was applied to bus bars of the junction box for 8 hours and suspended for 16 hours. This was repeated twice. There was initially no change to the bus bars and electrical components. However, after the third repetition, it was found that extra electric current passed between the bus bars, generating heat, and a portion of bus bars was melted. The heat also melted resin around bus bars such as an insulation plate, casing and resin portion of electrical components adjacent the casing.

Accordingly, it was confirmed that in consideration of normal use condition of an automobile, the application of the electric power at 42V to the electric/electronic component parts should not cause a problem.

BRIEF DESCRIPTION OF THE DRAWINGS

Embodiments of the present invention will be described below by way of non-limitative example, with reference to drawings, in which.

DETAILED DESCRIPTION OF PREFERRED EMBODIMENTS

Figure 1:
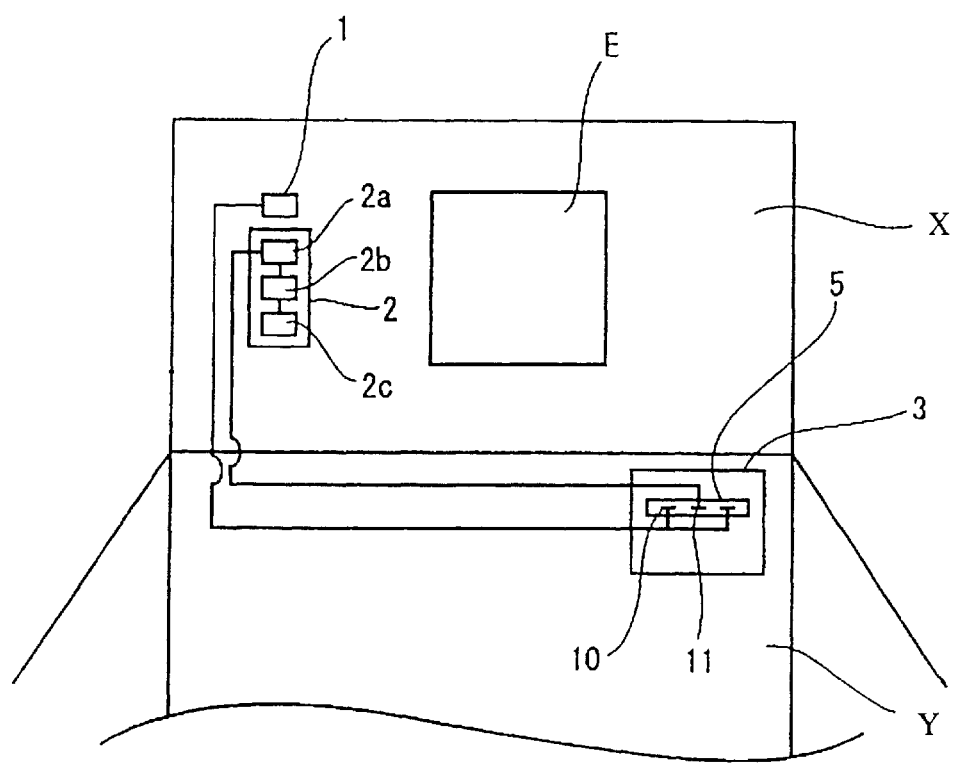
FIG. 1 is a diagram showing elements of a vehicle in an embodiment of the present invention.

As schematically shown in FIG. 1, in an automobile to which the present invention is applied, an engine E mounted in an engine room X provides drive of the vehicle and generates electrical power, e.g. through an alternator (not shown). A low-voltage battery 1 and a high-voltage battery 2 are mounted in the engine room X, and are charged by the alternator. The low-voltage battery 1 consists of a general-purpose battery having a rated voltage 12V and a nominal maximum voltage of 14V. The high-voltage battery 2 consists of three battery units 2a, 2b, and 2c connected in series to generate a nominal maximum voltage of 42V. Each of the three battery unit, 2a, 2b, and 2c a the rated voltage of 12V. Such 12V rechargeable (secondary) battery units are conventional. Needless to say, it is possible to use a single battery having a maximum voltage of 42V. The batteries 1, 2 themselves and their connections to the alternator are conventional and need not be described in detail here.

The low-voltage battery 1 is connected to a low-voltage bus bar 10 accommodated in an electrical connection box 3 composed of a junction box mounted in the vehicle interior Y (or, depending on the vehicle, in the engine room) to apply a low voltage (maximum voltage: 14V) to the low-voltage bus bar 10.

The high-voltage battery 2 is connected to a high-voltage bus bar 11 accommodated in the same electrical connection box 3 to apply a high voltage (maximum voltage: 42V) to the high-voltage bus bar 11.

The load side of the high-voltage bus bar 11 is connected to electrical devices or actuators to operate them electromotively. The actuators (not shown) include a power steering motor, suction and exhaust devices of the engine, and other devices consuming high power. The load side of the low-voltage bus bar 10 is connected to appliances (not shown) such as sensors, lamps, and other devices consuming relatively low power, such as are typically provided in an automobile.

Figure 2:
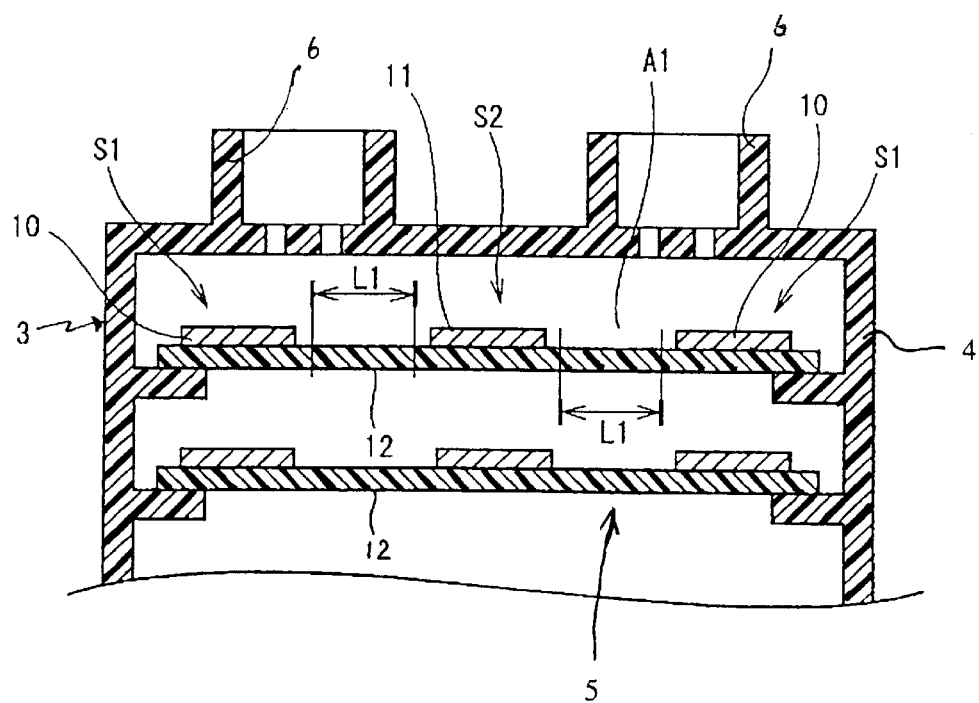
FIG. 2 is a partial sectional view of an electrical connection box embodying the invention, accommodating a circuit, applicable in the vehicle of FIG. 1.

As shown in FIG. 2, the electrical connection box 3 accommodates a circuit 5 having insulation plates 12 spaced one above another vertically, and mounted in a moulded plastics casing 4 which has sockets 6 for receiving connectors of wiring of the automobile.

Figure 3A:
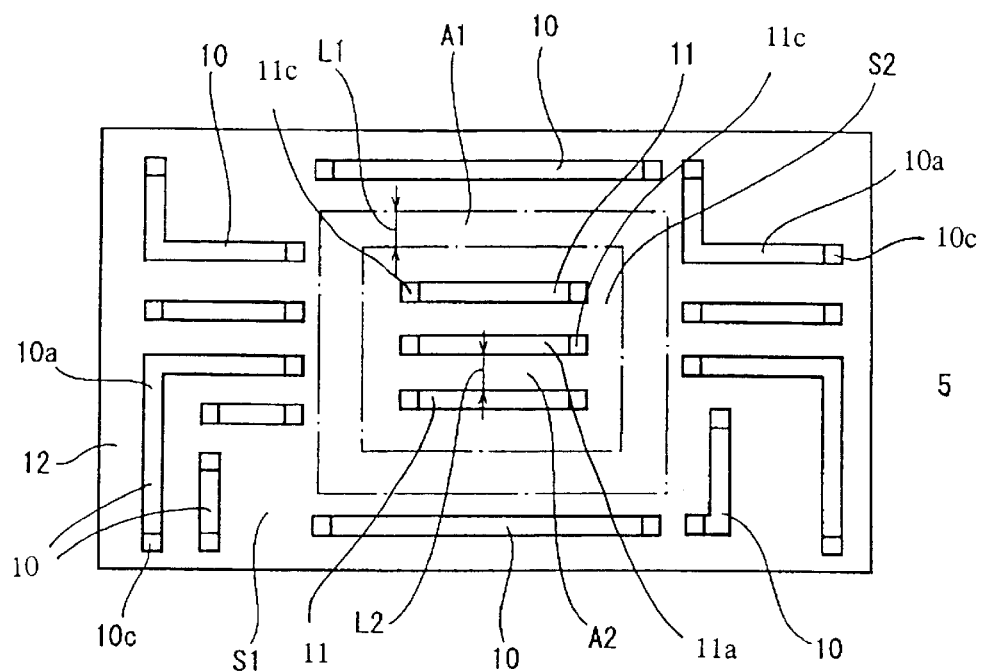
FIG. 3A is a plan view of the circuit of FIG. 2.

As shown in FIG. 3A, in the circuit, the face of the insulation plate 12 is partitioned into a peripheral section S1 and a central section S2. A plurality of low-voltage bus bars 10 are disposed in the peripheral section S1, whereas high-voltage bus bars 10 are disposed in the central section S2. An air insulation area A1, in the form of a surface region of the face to which bus bars are not fixed, is formed between the peripheral section S1 and the central section S2. The width L1 of the air insulation area A1 is in the range of from about 1 mm to about 30 mm. In the embodiment, the width L1 of the air insulation area A1 is 25 mm. There is no other component or element intervening between the bus bars in this air insulation area.

In the central section S2 in which the high-voltage bus bar 10 are disposed, an air insulation area A2 having a width in the range of from about 1 mm to about 30 mm exists between each adjacent pair of the high-voltage bus bars 11. In the embodiment, the width L2 of the air insulation area A2 is 10 mm.

Figure 3B:
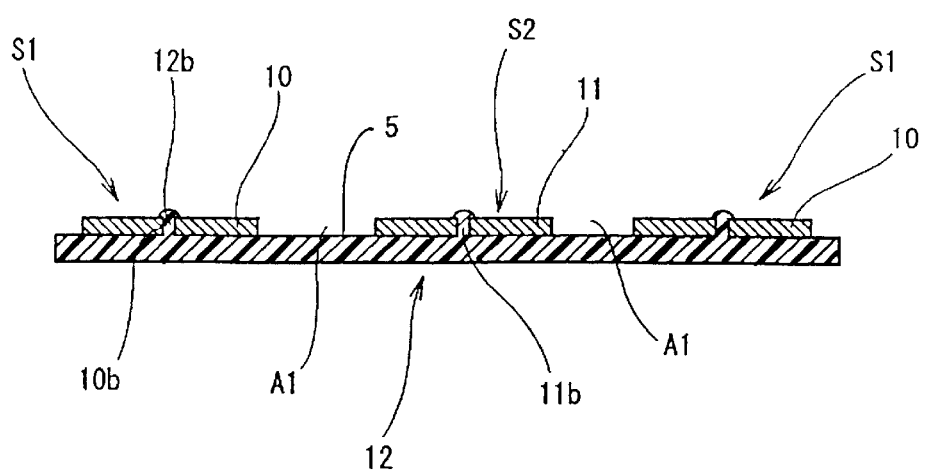
FIG. 3B is an enlarged sectional view showing a portion of the circuit of FIG. 2.

As shown in FIG. 3B, bus bar-fixing spigots 12b project from the upper surface of the thin flat substrate which is the insulation plate 12, in a known manner. The bus bar-fixing spigots 12b are inserted into installing holes 10b, 11b formed on in strip-shaped horizontal portions 10a, 11a of each low-voltage bus bars 10 and the high-voltage bus bar 11. Then, the upper end of the spigot 12b is caulked, i.e. deformed, to fix the bus bars 10, 11 in position on the surface of the substrate 12.

As in conventional circuits, the horizontal portions 10a, 11a may be bent vertically to form upstanding tabs 10c, 11c on the low-voltage bus bars 10 and the high-voltage bus bars 11 respectively.

Directly or through relaying or transfer terminals, the tabs 10c, 11c are connected to terminals of external circuits through connectors provided on the outer surface of the electrical connection box 3 by fitting the terminals onto the tabs 10c, 11c. The tabs 10c, 11c may project into the connector sockets 6 shown in FIG. 2, as appropriate. For example, a terminal mounted at an end of an electric wire connected to the low-voltage battery 1 is fitted on the tab 10c at the power supply side of the low-voltage bus bar 10 and a terminal mounted at an end of an electric wire connected to the high-voltage battery 2 is fitted on the tab 11c at the power supply side of the high-voltage bus bar 11.

Although the low-voltage bus bar 10 and the high-voltage bus bar 11 having different operating voltages are disposed on the same plate 12 in the circuit 5, they are separately disposed in the sections S1 and S2, with the air insulation area A1 interposed between the sections S1 and S2. Thus, it is possible to prevent leak current from being generated between the low-voltage bus bars 10 and the high-voltage bus bars 11. Further, the air insulation area A2 is disposed in the section S2 in which the high-voltage bus bars 10 are adjacent. Thus, it is possible to prevent the leak current from being generated between the high-voltage bus bars 11.

The circuit 5 of the embodiment illustrated is intended for an automobile in which a battery of the rated voltage of 12V is mounted. However, in the case where a maximum voltage of 28V is applied to a bus bar in an automobile or a truck, the bus bar to which the voltage of 28V is applied is the low-voltage bus bar and the bus bar to which the voltage of 42V is applied is the high-voltage bus bar. The construction of the circuit 5 disposed in the electrical connection box is in this case the same as that of the illustrated embodiment.

In the embodiment, the maximum voltage of 42V is applied to the high-voltage bus bar 11. But needless to say, a high voltage of 42V to 200V can be applied to the high-voltage bus bar 11, provided that the battery structure 2 is sufficiently light in weight and safety is ensured.

Figure 4:
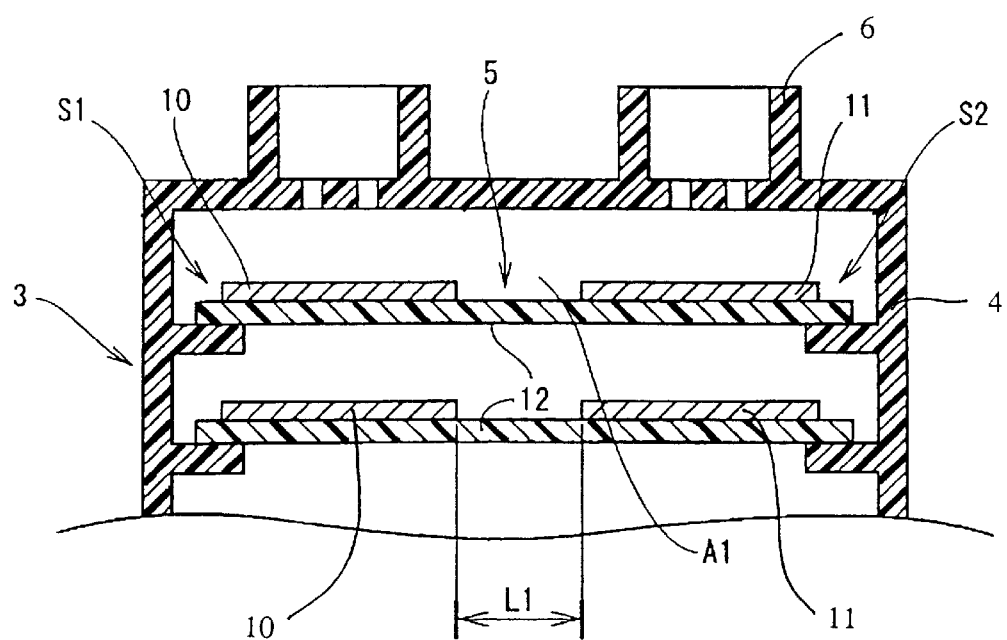
FIG. 4 is a partial sectional view of a second electrical connection box embodying the invention, applicable in the vehicle of FIG. 1, and containing a circuit.
Figure 5A:
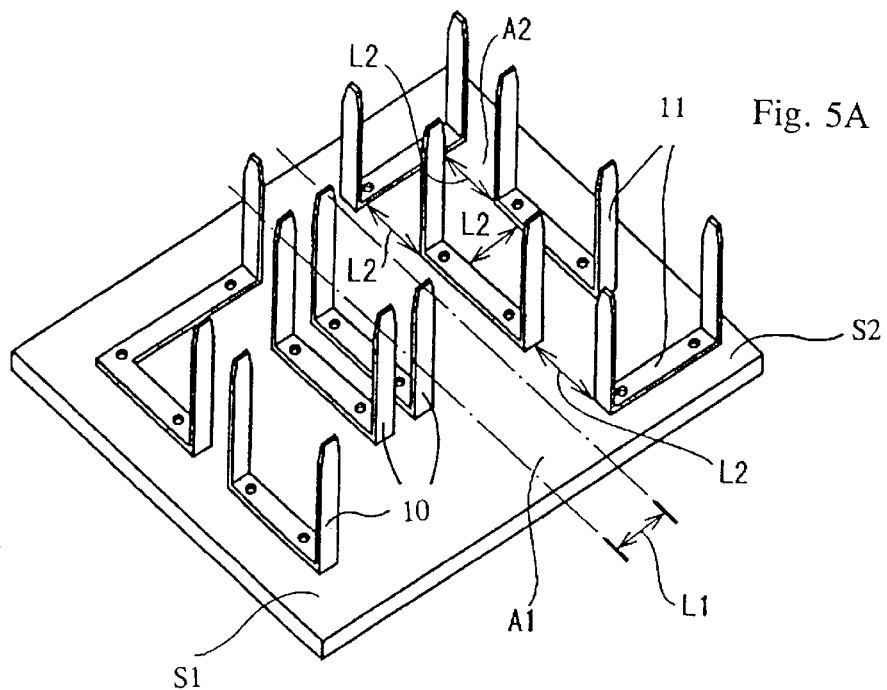
FIG. 5A is a perspective view of a circuit of the box of FIG. 4.
Figure 5B:
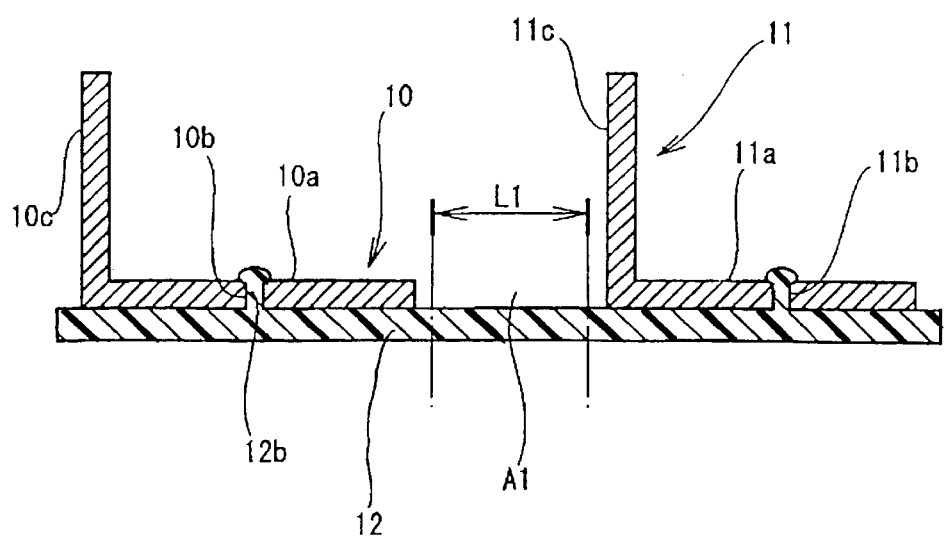
FIG. 5B is an enlarged sectional view showing a portion of the circuit of FIG. 5A.
Figure 6:
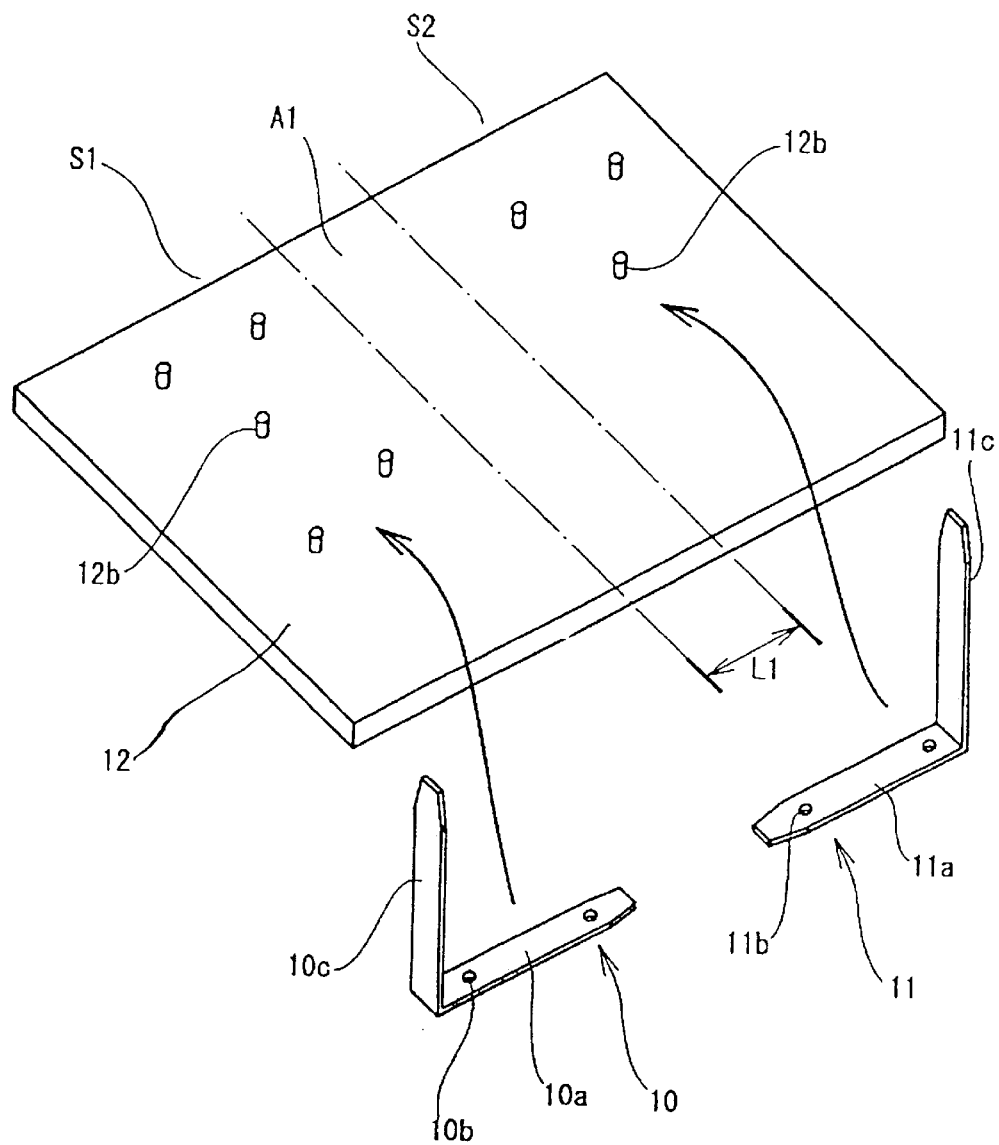
FIG. 6 is a perspective view illustrating the assembly of the circuit of FIG. 4.

FIGS. 4 to 6 show a second embodiment of the electrical connection box 3 of FIG. 1. The same reference numbers are used in these figures, and in all Figures described below, for parts which are the same as or similar to the parts in FIGS. 1 to 3, and their description will not be fully repeated.

As shown in FIG. 4, the electrical connection box 3 accommodates a circuit 5 including insulating plates 12 which are stacked vertically in a moulded plastics casing 4 having connector sockets 6. As shown in FIGS. 5A and 5B, in the circuit, the face of each insulation plate 12 is divided into spaced regions or section S1 and S2 in the left-to-right direction thereof. All the low-voltage bus bars 10 are disposed in the section S1, whereas all the high-voltage bus bars 11 are disposed in the section S2. An empty air insulation area A1, to which no bus bars and no other components are fixed, is formed between the section S1 and S2. The width L1 of the air insulation area A1 is from about 1 mm to about 30 mm, and in this embodiment is 20 mm.

In the section S2 in which the high-voltage bus bars 10 are disposed, an air insulation area A2 having a width in the range of from about 1 mm to about 30 mm is disposed between each adjacent pair of high-voltage bus bars 11. In this embodiment, the width L2 of the air insulation area A2 is 10 mm.

As shown in FIGS. 5A–6, bus bar-fixing spigots 12b project from the upper surface of a thin flat substrate 12a of the insulation plate 12, in a conventional manner, and are inserted into installing holes 10b, 11b formed on the strip-shaped horizontal portions 10a, 11a of the bus bars 10, 11.

Then, the upper ends of each of the spigots 12b are caulked or deformed to fix the bus bars to the surface of the substrate 12.

As in the case of the first embodiment shown in FIGS. 2–3B, the bus bars 10 and 11 are bent vertically to form tabs 10c and 11c, which directly or through relaying terminals are connected to terminals of external circuits through connectors mounted on the outer surface of the electrical connection box 3.

Although the low-voltage bus bars 10 and the high-voltage bus bars 11 having different applied voltages are disposed in the circuit 5 on the same plate 12, the low-voltage bus bars 10 and the high-voltage bus bars 11 are separately disposed in the sections S1 and S2, with the air insulation area A1 interposed between the sections S1 and S2. Thus, it is possible to prevent leak current from being generated between the low-voltage bus bars 10 and the high-voltage bus bars 11 to which different voltages are applied. Further, the air insulation areas A2 are provided in the section S2, to prevent leak current from being generated between the high-voltage bus bars 11.

Figure 7:
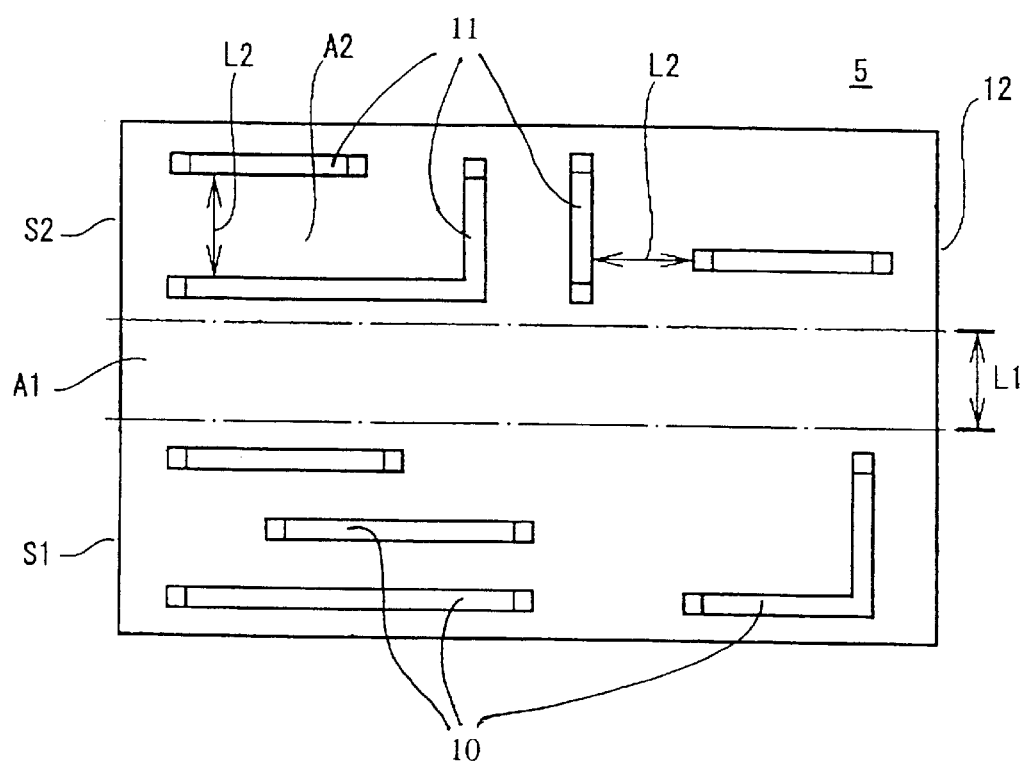
FIG. 7 is a plan view of a modified form of the circuit of FIG. 4.

As shown in FIG. 7, it is possible alternatively to divide the insulation plate 12 of FIG. 5 into a front section S1 and a rear section S2 to dispose the low-voltage bus bars 10 collectively in the front section S1 and the high-voltage bus bars 11 collectively in the rear section S2.

Figure 8:
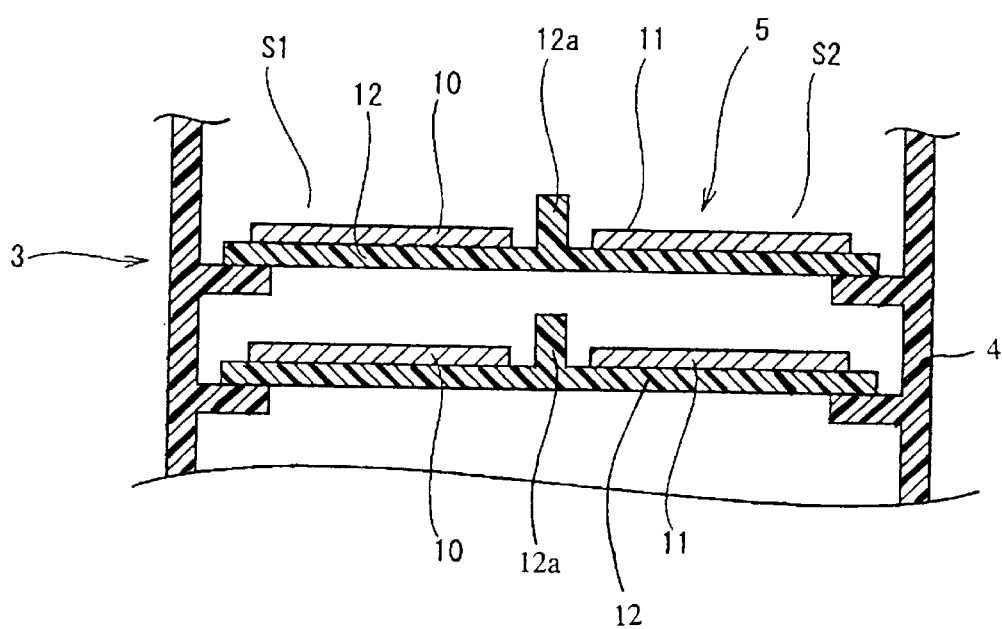
FIG. 8 is a partial sectional view of a third electrical connection box embodying the invention, applicable in the vehicle of FIG. 1, and containing a circuit.
Figure 9A:
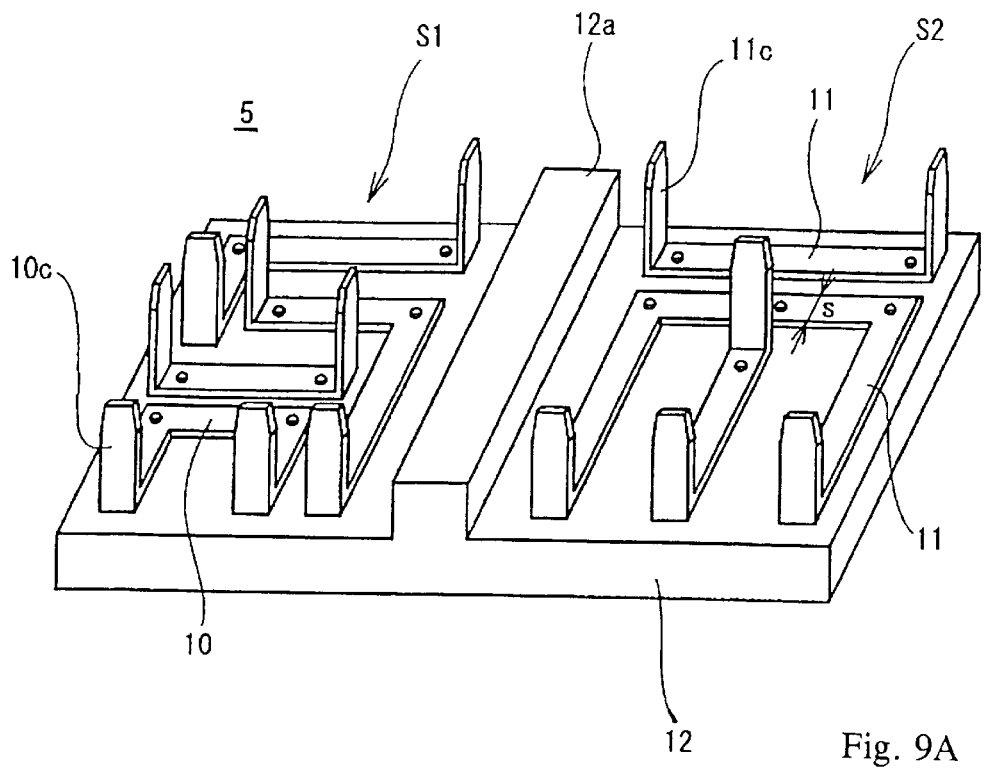
FIG. 9A is a perspective view of the circuit of FIG. 8.
Figure 9B:
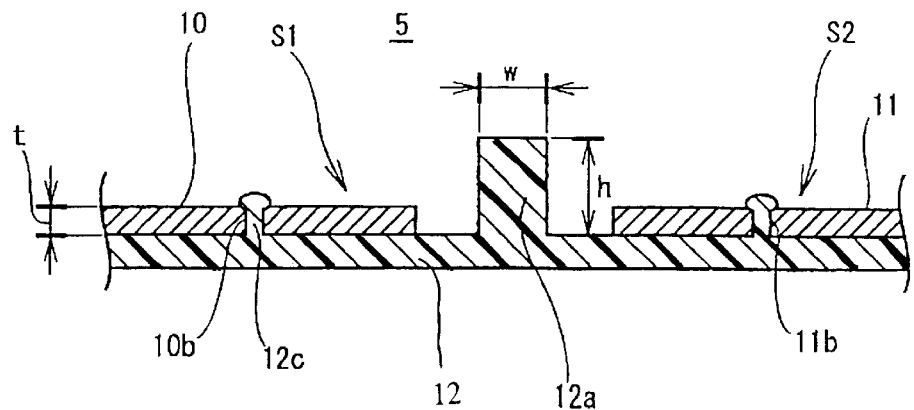
FIG. 9B is an enlarged sectional view showing a portion of the circuit of FIG. 9A.

FIGS. 8 and 9 show a third embodiment of the electrical junction box 3 of FIG. 1. As in the above embodiments, the electrical connection box 3 of FIG. 8 accommodates a circuit 5 including insulating plates 12 stacked vertically in the moulded plastics casing 4. As shown in FIGS. 9A and 9B, in the circuit 5, each insulation plate 12 is partitioned into sections S1 and S2 in the left-to-right direction thereof. An electrically insulating partition wall 12a, integral with the plate 12, projects upwardly from the planar main body of the insulation plate 12 between the sections S1 and S2. All the low-voltage bus bars 11 are disposed in the section S1, whereas all the high-voltage bus bars 10 are disposed in the section S2, with the wall 12a interposed therebetween.

The wall 12a projects from the insulation plate 12 at the center in its left-to-right direction and extends over the whole length of the plate 12 in its front-to-back direction. Supposing that the thickness of each of the low-voltage bus bars 10 and the high-voltage bus bars 11 is t, the height h of the wall 12a is given by t<h≦10t. Supposing that the maximum width of each of the low-voltage bus bars 10 and the high-voltage bus bars 11 is s, the width w of the wall 12a is given by 1.5 mm<w≦10s.

As in the above embodiments, the spigots 12b projecting from the upper surface of the plate 12 are inserted into holes 10b, 11b formed on horizontal portions 10a, 11a of the bus bars 10, 11 and caulked to fix the bus bars 11 to the surface of the plate 12.

The bus bar strips are bent vertically to form tabs 10c, 11c. These tabs function as described above.

In this embodiment, although the low-voltage bus bars 10 and the high-voltage bus bars 11 having different applied voltages are disposed in the circuit 5 on the same plate 12, the low-voltage bus bars 10 and the high-voltage bus bars 11 are separately disposed on the insulation plate 12, with the wall 12a interposed between the sections S1 and S2. Thus, it is possible to prevent or minimise leak currents from passing between the low-voltage bus bars 10 and the high-voltage bus bars 11.

Figure 10:
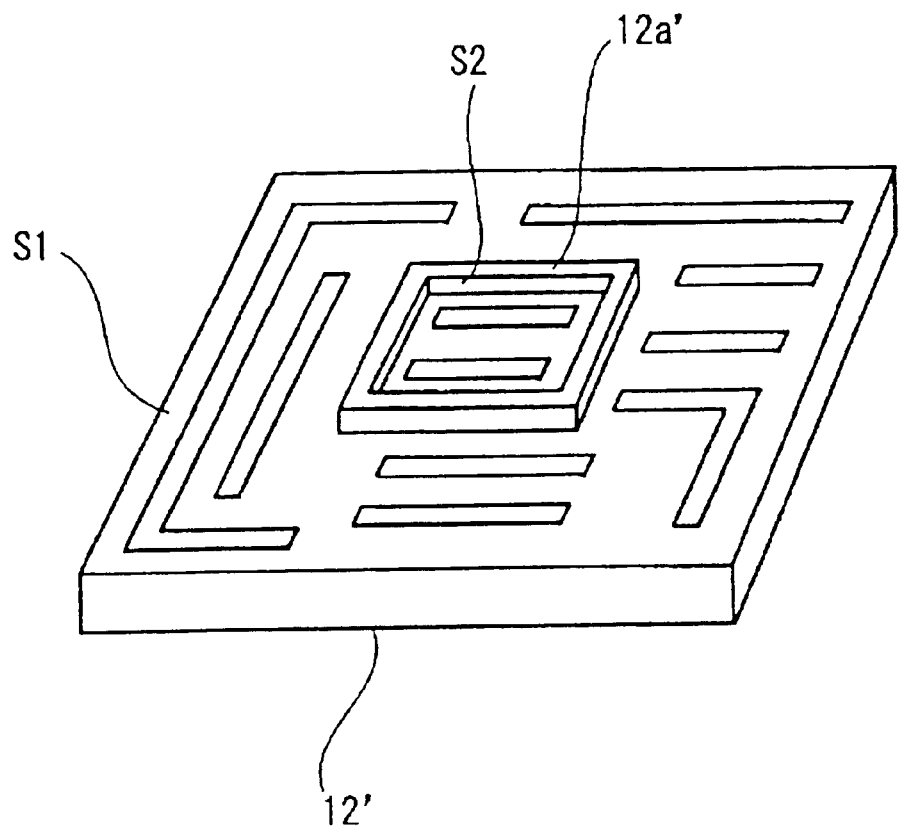
FIG. 10 is a perspective view of a modified form of the circuit of FIG. 9A.

FIG. 10 shows a modification of this embodiment in which an insulation plate 12 of the circuit 5 is partitioned into a section S2 located in the central part of the insulation plate 12' and a peripheral section S1 surrounding the section S2. The high-voltage bus bars 11 are disposed in the section S2. The low-voltage bus bars 10 are disposed in the section S1. A insulation partitioning wall 12a' projects between the section S1 and the section S2, and extends in a separate shape around the central section S2.

Figure 11:
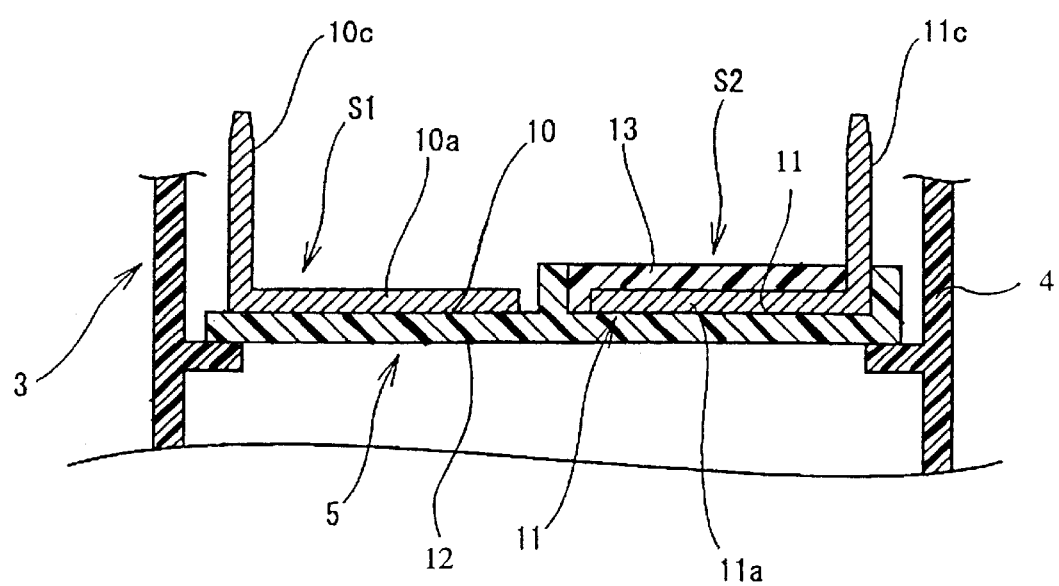
FIG. 11 is a partial sectional view of a fourth electrical connection box embodying the invention, applicable in the vehicle of FIG. 1, and containing a circuit.
Figure 12A:
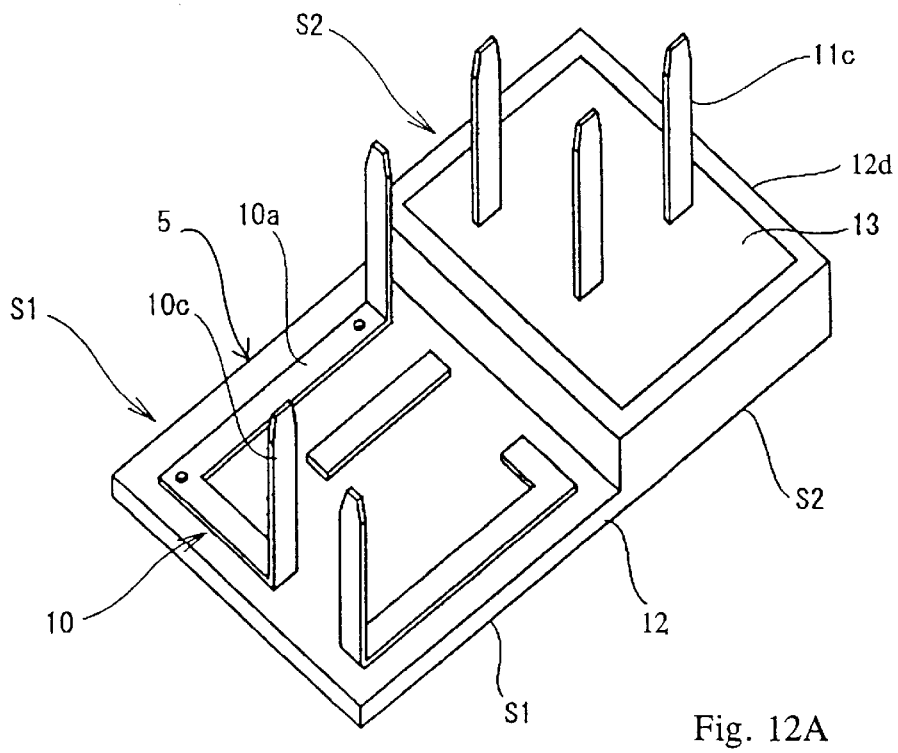
FIG. 12A is a perspective view of the circuit of FIG. 11.
Figure 12B:
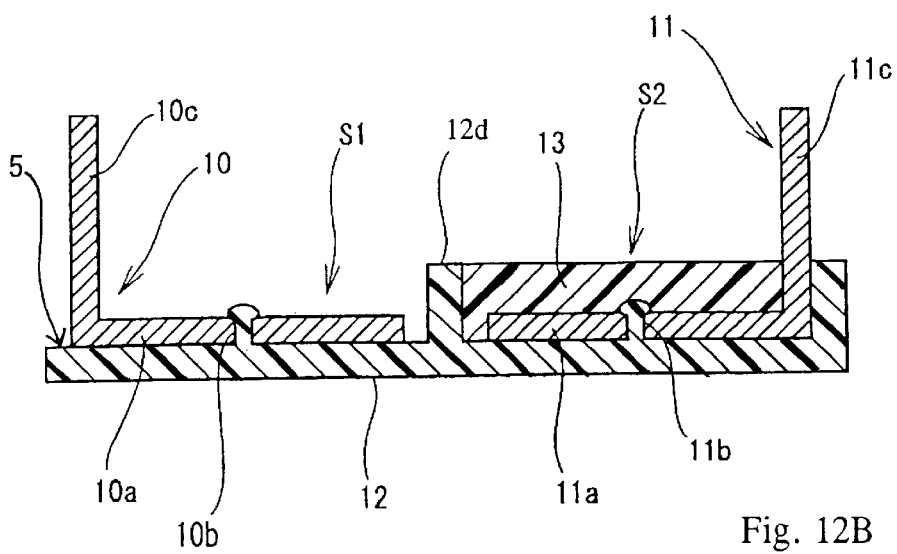
FIG. 12B is an enlarged sectional view of a portion of the circuit of FIG. 12A.
Figure 13:
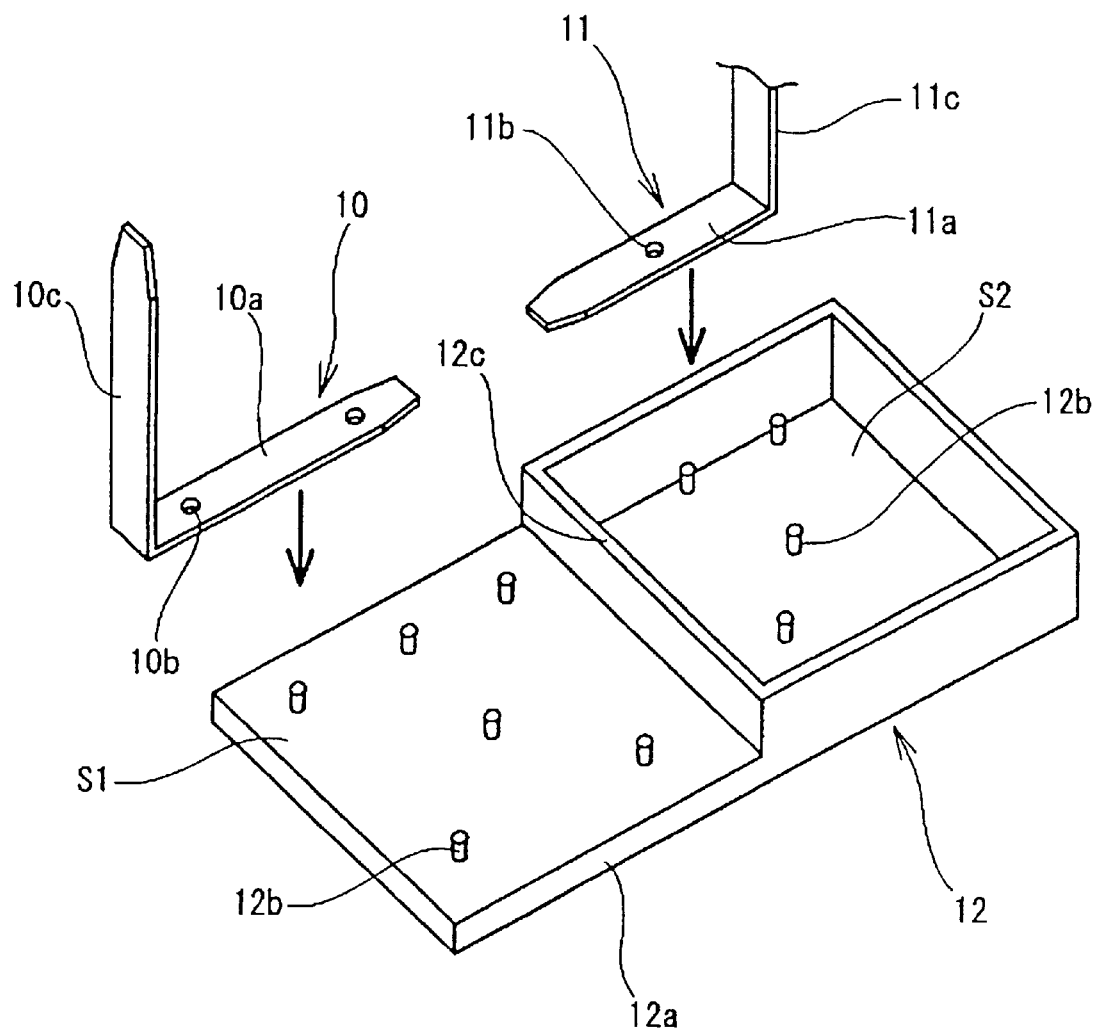
FIG. 13 is a perspective view showing a stage in the assembly of the circuit of FIG. 12A.

FIGS. 11, 12A and 12B show a fourth embodiment of the electrical junction box 3 of FIG. 1. FIG. 11 shows a single insulation plate 12 of the circuit 5 mounted in the moulded plastics casing 4, but as in the other embodiments the circuit 5 may have a plurality of such plates. FIGS. 11–12B show a thin region or section S1 of the plate at one side and a thicker region or section S2 at the other side, having its top surface stepped up from that of section S1.

In the section S1, all the low-voltage bus bars 10 are fixed to the upper surface of the insulation plate 12 and exposed to the air. In the section S2, all the high-voltage bus bars 11 are fixed to the upper surface of the insulation plate 12 and are embedded in an insulating covering layer 13.

As in the other embodiments, spigots 12b project from the upper surface of a thin plate 12, and fix the bus bars in place. A peripheral wall 12d, integral with the insulation plate 12, surrounding the section S2, stands up the insulation plate 12.

In the section S2, after the high-voltage bus bars 11 are fixed to the insulation plate 12, epoxy resin, two-part hardening resin or grease is poured into the peripheral wall 12c to embed the high-voltage bus bars 11 in the insulating covering layer 13. Thus, the layer 13 is filled between the adjacent high-voltage bus bars 11, thus preventing a leak current from being generated between the adjacent high-voltage bus bars 11.

Epoxy resin, two-part hardening resin, and/or grease are preferable as the insulating material to be poured into the peripheral wall 12c. It is preferable to use resin having a melting point lower than that of the plate 12 and a thermal coefficient of shrinkage and a thermal coefficient of expansion similar to those of the substrate 12a. A hole may be formed in the section S2 of the plate 12 so that the resin fills into the hole, and is fixed to the substrate 12a with a high strength.

As in other embodiments the strip-shaped bus bars are bent vertically to form connection tabs 10c, 11c. The tabs 11c of the high-voltage bus bar 11 project upward from the upper surface of the resinous covering layer 13.

Although the low-voltage bus bars 10 and the high-voltage bus bars 11 having different applied voltages are disposed in the circuit 5 on the same plate 12, the low-voltage bus bars 10 and the high-voltage bus bars 11 are separately disposed on the plate 12, and the high-voltage bus bars 11 are embedded in the resinous covering layer 13. Thus, it is possible to prevent or minimise leak currents from being generated between the low-voltage bus bars 10 and the high-voltage bus bars 11, and between the adjacent high-voltage bus bars 11.

The present invention therefore makes it possible to reduce the diameter of electric wires and that of wire harnesses in a vehicle by reducing the amount of electric current, by applying a high voltage to circuits of the electrical connection box, while preventing leak currents from being generated between the low-voltage bus bars and the high-voltage bus bars. It is also possible to avoid leak current from being generated between the high-voltage bus bars.

While the invention has been illustrated by the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

What is claimed is:

1. A vehicle comprising:
   an internal combustion engine providing motive drive of the vehicle;
   a first, low-voltage battery structure comprising at least one secondary battery, and having a nominal maximum output voltage selected from a range of from about 14V to about 28V;
   a second, high-voltage battery structure comprising at least one secondary battery, and having a nominal maximum output voltage higher than that of said first battery structure and not more than 200V;
   a plurality of electrical devices powered by said first and second battery structures; and
   an electrical connection box containing an electrical circuit therein which effects connection between said first and second battery structures and said plurality of electrical devices said electrical circuit having an insulation plate and, fixed on one face of said insulation plate, at least one first bus bar connected to said first battery structure and at least one second bus bar connected to said second battery structure, whereby in operation said first and second bus bars are at different potentials,
   wherein, in order to reduce a risk of electrical leakage paths on said insulation plate, at least one of the following features is present:
   (i) said at least one first bus bar and said at least one second bus bar are separated on said face of said insulation plate by an air insulation zone containing no bus bars and having a width in a range of from about 1 mm to about 30 mm;
   (ii) an insulation wall is upstanding from said face of said insulation plate between said at least one first bus bar and said at least one second bus bar; and
   (iii) said at least one second bus bar is at least partially embedded in insulating material including at least one of synthetic resin and grease, while said at least one first bus bar is exposed on said face of said insulation plate.

2. A vehicle according to claim 1, wherein said feature (i) is present, and a plurality of said second bus bars are located at a central region of said face of said insulation plate as seen in plan view while a plurality of said first bus bars are located at a peripheral region of said face as seen in plan view.

3. A vehicle according to claim 2, wherein at said central region of said face, said second bus bars are separated by air insulation zones.

4. A vehicle according to claim 1, wherein said feature (i) is present, and a plurality of said second bus bars are present at one region of said face of said insulation plate, adjacent pairs of said second bus bars in said region being spaced from each other on said face by about 1 mm to about 30 mm.

5. A vehicle according to claim 1, wherein said feature (ii) is present and a height h and a width w of said partition wall above said face of said insulation plate satisfy the relations (1) and (2):

$$t < h \leq 20t \tag{1}$$

$$1.5 < w \leq 20s \tag{2}$$

where t is the uniform thickness of said first and second bus bars and s is the maximum width of said first and second bus bars, and h, w, t and s are all in mm.

6. A vehicle according to claim 5, wherein w and h satisfy the relations (3) and (4):

$$t < h \leq 10t \tag{3}$$

$$1.5 < w \leq 10s \tag{4}.$$

7. A vehicle according to claim 5, wherein said face of said insulation plate has a pair of opposite edges, and a plurality of said first bus bars are located in a first region of said face adjacent a first one of said edges while a plurality of said second bus bars are located in a second region of said face which is spaced from said first region and is adjacent the other of said edges of said face.

8. A vehicle according to claim 5, wherein a plurality of said second bus bars are located at a central region of said face of said insulation plate as seen in plan view while a plurality of said first bus bars are located at a peripheral region of said face as seen in plan view.

9. A vehicle according to claim 1, wherein said feature (iii) is present and an upstanding peripheral wall surrounds a region of said face of said insulation plate at which said at least one second bus bar is located, and said insulating material is filled as a layer into a space bounded by said upstanding peripheral wall so as to cover and embed said second bus bar.

10. A vehicle according to claim 9, wherein said insulating material is selected from epoxy resin, two-part hardening resin and grease.

11. A vehicle according to claim 1, wherein said nominal maximum output voltage of said second battery structure is 42V.

12. An electrical connection box adapted for use in a vehicle which has a first, low-voltage battery structure comprising at least one secondary battery, and having a nominal maximum output voltage selected from a range of from about 14V to about 28V, and a second, high-voltage battery structure comprising at least one secondary battery, and having a nominal maximum output voltage higher than that of said first battery structure and not more than 200V, said electrical connection box containing an electrical circuit having an insulation plate and, fixed on one face of said insulation plate, at least one first bus bar adapted to be connected in use to said first battery structure and at least one second bus bar adapted to be connected in use to said second battery structure, whereby in operation said first and second bus bars are at different potentials, wherein, in order to reduce a risk of electrical leakage paths on said insulation plate, at least one of the following features is present:
(i) said at least one first bus bar and said at least one second bus bar are separated on said face of said insulation plate by an air insulation zone containing no bus bars and having a width in the range of from about 1 mm to about 30 mm,
(ii) an insulation wall is upstanding from said face of said insulation plate between said at least one first bus bar and said at least one second bus bar,
(iii) said at least one second bus bar is at least partially embedded in insulating material including at least one synthetic resin and grease, while said at least one first bus is exposed on said face of said insulation plate.

13. An electrical connection box according to claim 12, wherein said feature (i) is present, and a plurality of said second bus bars are located at a central region of said face of said insulation plate as seen in plan view while a plurality of said first bus bars are located at a peripheral region of said face as seen in plan view.

14. An electrical connection box according to claim 13, wherein at said central region of said face, said second bus bars are separated by air insulation zones.

15. An electrical connection box according to claim 12, wherein said feature (i) is present, and a plurality of said second bus bars are present at one region of said face of said insulation plate, adjacent pairs of said second bus bars in said region being spaced from each other on said face by from about 1 mm to about 30 mm.

16. An electrical connection box according to claim 12, wherein said feature (ii) is present and the height h and width w of said partition wall above said face of said insulation plate satisfy the relations (1) and (2):

$$t<h\leq 20t \quad (1)$$

$$1.5<w\leq 20s \quad (2)$$

where t is the uniform thickness of said first and second bus bars and s is the maximum width of said first and second bus bars, and h, w, t and s are all in mm.

17. An electrical connection box according to claim 16, wherein w and h satisfy the relations (3) and (4):

$$t<h\leq 10t \quad (3)$$

$$1.5<w\leq 10s \quad (4).$$

18. An electrical connection box according to claim 16, wherein said face of said insulation plate has a pair of opposite edges, and a plurality of said first bus bars are located in a first region of said face adjacent a first one of said edges while a plurality of said second bus bars are located in a second region of said face plate which is spaced from said first region and is adjacent the other of said edges of said face.

19. An electrical connection box according to claim 16, wherein a plurality of said second bus bars are located at a central region of said face of said insulation plate as seen in plan view while a plurality of said first bus bars are located at a peripheral region of said face as seen in plan view.

20. An electrical connection box according to claim 12, wherein said feature (iii) is present and an upstanding peripheral wall surrounds a region of said face of said insulation plate at which said at least one second bus bar is located, and said insulating material is filled as a layer into a space bounded by said upstanding peripheral wall so as to cover and embed said second bus bar.

21. An electrical connection box according to claim 20, wherein said insulating material is selected from epoxy resin, two-part hardening resin and grease.

22. An electrical connection box adapted for use in a vehicle which has a first, low-voltage battery structure comprising at least one secondary battery, and having a nominal maximum output voltage selected in a range from about 14V to about 28V, and a second, high-voltage battery structure comprising at least one secondary battery, and having a nominal maximum output voltage higher than that of said first battery structure and not more than 200V, said electrical connection box containing an electrical circuit having an insulation plate and, fixed on one face of said insulation plate, at least one first bus bar adapted to be connected in use to said first battery structure and at least one second bus bar adapted to be connected in use to said second battery structure, whereby in operation said first and second bus bars are at different potentials, wherein, in order to reduce a risk of electrical leakage paths on said insulation plate said at least one first bus bar and said at least one second but bar are separated on said face of said insulation plate by an air insulation zone containing no bus bars and having a width in the range of from about 1 mm to about 30 mm.

23. An electrical connection box adapted for use in a vehicle which has a first, low-voltage battery structure comprising at least one secondary battery, and having a nominal maximum output voltage selected in a range from about 14V to about 28V, and a second, high-voltage battery structure comprising at least one secondary battery, and having a nominal maximum output voltage higher than that of said first battery structure and not more than 200V, said electrical connection box containing an electrical circuit having an insulation plate and, fixed on one face of said insulation plate, at least one first bus bar adapted to be connected in use to said first battery structure and at least one second bus bar adapted to be connected in use to said second battery structure, whereby in operation said first and second bus bars are at different potentials, wherein, in order to reduce a risk of electrical leakage paths on said insulation plate; and an insulation wall is upstanding from said face of said insulation plate between said at least one first bus bar and said at least one second bus bar.

24. An electrical connection box adapted for use in a vehicle which has a first, low-voltage battery structure comprising at least one secondary battery, and having a nominal maximum output voltage selected in a range from about 14V to about 28V, and a second, high-voltage battery structure comprising at least one secondary battery, and having a nominal maximum output voltage higher than that of said first battery structure and not more than 200V, said electrical connection box containing an electrical circuit having an insulation plate and, fixed on one face of said insulation plate, at least one first bus bar adapted to be connected in use to said first battery structure and at least one second bus bar adapted to be connected in use to said second battery structure, whereby in operation said first and second bus bars are at different potentials, wherein, in order to reduce a risk of electrical leakage paths on said insulation plate said at least one second bus bar is at least partially embedded in insulating material include at least one of synthetic resin and grease, while said at least one first bus is exposed on said face of said insulation plate.

* * * * *

UNITED STATES PATENT AND TRADEMARK OFFICE
CERTIFICATE OF CORRECTION

PATENT NO.    : 6,650,087 B2
DATED         : November 18, 2003
INVENTOR(S)   : Yuasa et al.

It is certified that error appears in the above-identified patent and that said Letters Patent is hereby corrected as shown below:

<u>Title page,</u>
Item [30], Foreign Application Priority Data, delete
"Jul. 4, 2001   (JP) ...........................2000-202235"

Signed and Sealed this

Ninth Day of March, 2004

JON W. DUDAS
*Acting Director of the United States Patent and Trademark Office*